United States Patent
Arnold et al.

(10) Patent No.: US 7,202,702 B2
(45) Date of Patent: Apr. 10, 2007

(54) OUTPUT BUFFER SLEW RATE CONTROL USING CLOCK SIGNAL

(75) Inventors: Barry J. Arnold, Fort Collins, CO (US); Kenneth Koch, II, Fort Collins, CO (US); Philip L. Barnes, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 109 days.

(21) Appl. No.: 10/732,687

(22) Filed: Dec. 10, 2003

(65) Prior Publication Data

US 2005/0127947 A1   Jun. 16, 2005

(51) Int. Cl.
*H03K 19/0175* (2006.01)
(52) U.S. Cl. .......................... 326/87; 326/83
(58) Field of Classification Search ................. 326/26, 326/27, 30, 83–90
See application file for complete search history.

(56) References Cited

U.S. PATENT DOCUMENTS

| | | | |
|---|---|---|---|
| 4,614,882 A | 9/1986 | Parker et al. | |
| 4,972,101 A | 11/1990 | Partovi et al. | |
| 4,975,598 A | 12/1990 | Borkar | |
| 5,134,311 A * | 7/1992 | Biber et al. ................. | 327/108 |
| 5,336,940 A | 8/1994 | Sorrells et al. | |
| 5,497,105 A | 3/1996 | Oh et al. | |
| 5,719,514 A | 2/1998 | Sato | |
| 5,768,177 A | 6/1998 | Sakuragi | |
| 5,869,983 A | 2/1999 | Ilkbahar et al. | |
| 5,898,321 A | 4/1999 | Ilkbahar et al. | |
| 5,959,481 A * | 9/1999 | Donnelly et al. ........... | 327/170 |
| 5,973,526 A | 10/1999 | Dabral | |
| 6,047,346 A | 4/2000 | Lau et al. | |
| 6,087,868 A | 7/2000 | Millar | |
| 6,130,563 A * | 10/2000 | Pilling et al. ............... | 327/111 |
| 6,154,083 A | 11/2000 | Gaudet et al. | |
| 6,194,916 B1 | 2/2001 | Nishimura et al. | |
| 6,236,695 B1 | 5/2001 | Taylor | |
| 6,278,306 B1 | 8/2001 | Ang et al. | |
| 6,281,729 B1 | 8/2001 | Ang et al. | |
| 6,288,563 B1 | 9/2001 | Muljono et al. | |
| 6,297,677 B1 | 10/2001 | Ang et al. | |
| 6,320,407 B1 * | 11/2001 | Sakamoto .................... | 326/27 |
| 6,323,687 B1 * | 11/2001 | Yano ........................... | 326/83 |
| 6,366,139 B1 | 4/2002 | Ang et al. | |
| 6,417,705 B1 * | 7/2002 | Tursi et al. ................. | 327/158 |
| 6,448,807 B1 * | 9/2002 | Ahsanullah ................. | 326/30 |
| 6,452,428 B1 | 9/2002 | Mooney et al. | |
| 6,489,807 B2 * | 12/2002 | Genna et al. ................ | 326/56 |
| 6,509,780 B1 | 1/2003 | Lim et al. | |

(Continued)

FOREIGN PATENT DOCUMENTS

WO    WO 98/36497    8/1998

OTHER PUBLICATIONS

Gabara, Thaddeus J., et al., "Forming Damped LRC Parasitic Circuits in Simultaneously Switched CMOS Output Buffers," IEEE Journal of Solid-State Circuits, vol. 32, No. 3, pp. 407-418 (Mar. 1997).

(Continued)

*Primary Examiner*—Don Le

(57) ABSTRACT

A signal generated by circuitry for an output buffer is identified relative to a clock signal to control a slew rate of the circuitry for an output buffer.

24 Claims, 9 Drawing Sheets

U.S. PATENT DOCUMENTS

| | | | |
|---|---|---|---|
| 6,518,808 B2 * | 2/2003 | Shimoda | 327/172 |
| 6,529,037 B1 | 3/2003 | Haycock et al. | |
| 6,535,039 B2 | 3/2003 | Nanba et al. | |
| 6,538,464 B2 | 3/2003 | Muljono et al. | |
| 6,617,895 B2 * | 9/2003 | Zumkehr et al. | 327/170 |
| 6,636,069 B1 | 10/2003 | Muljono | |
| 6,646,483 B2 * | 11/2003 | Shin | 327/112 |
| 6,744,287 B2 * | 6/2004 | Mooney et al. | 327/108 |
| 6,768,363 B2 * | 7/2004 | Yoo et al. | 327/170 |
| 6,784,708 B1 * | 8/2004 | Krenzke | 327/170 |
| 6,894,547 B2 * | 5/2005 | Takahashi | 327/170 |
| 2003/0025541 A1 | 2/2003 | Humphrey et al. | |
| 2003/0112042 A1 | 6/2003 | Takahashi | |
| 2003/0151433 A1 | 8/2003 | Takai | |

OTHER PUBLICATIONS

Ilkbahar, Alper, et al., "Itanium(TM) Processor System Bus Design," IEEE Journal of Solid-State Circuits, vol. 36, No. 10, pp. 1565-1573 (Oct. 2001).

Muljono, H., et al., "A 400MT/s 6.4GB/s Multiprocessor Bus Interface," IEEE International Solid-State Circuits Conference (ISSCC), 46 page slide presentation (Feb. 9-13, 2003).

* cited by examiner

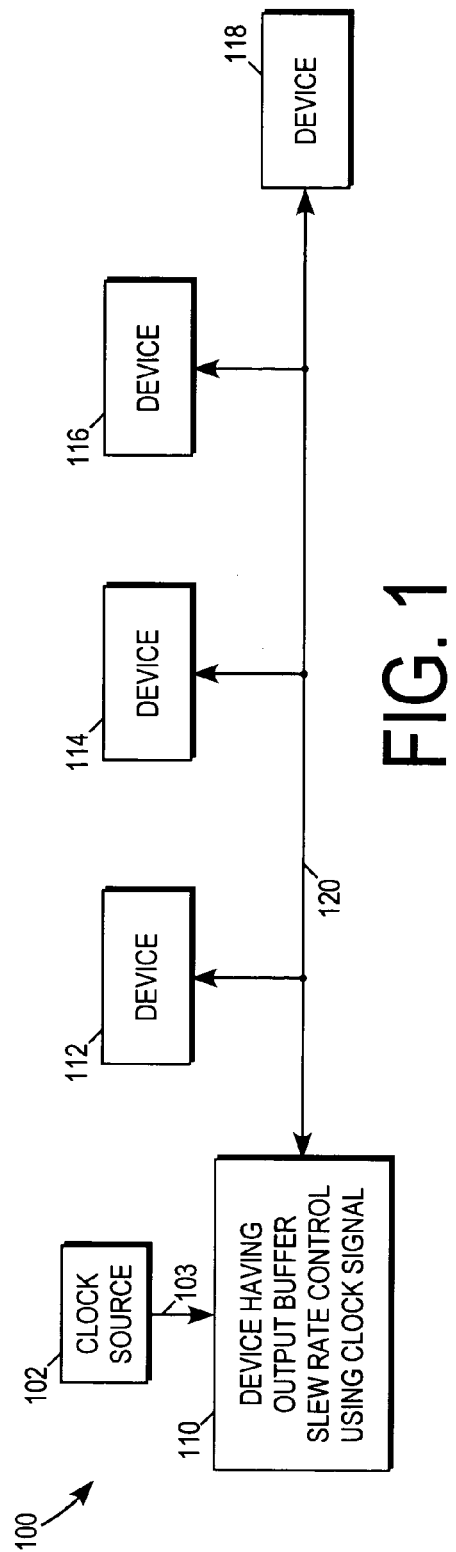
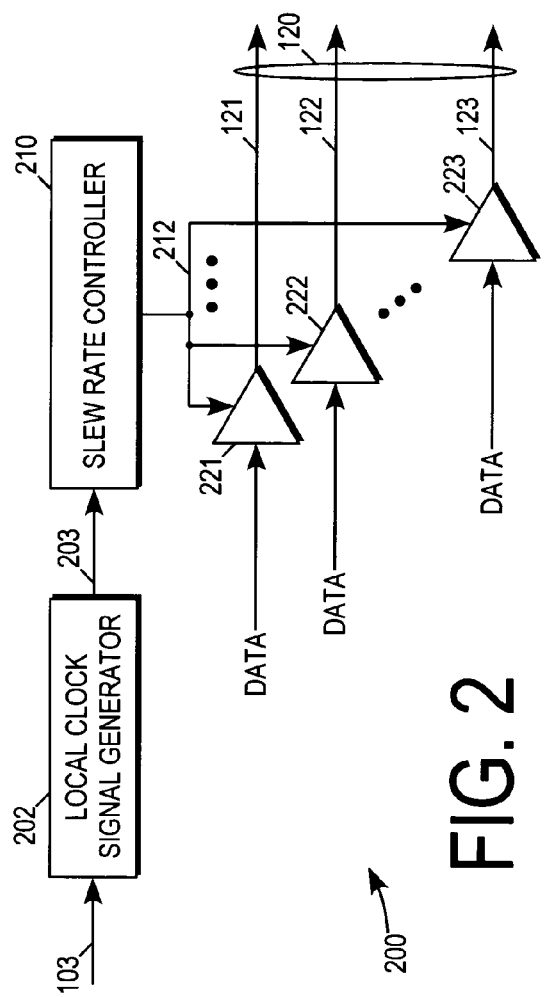

OUTPUT BUFFER SLEW RATE CONTROL USING CLOCK SIGNAL

BACKGROUND ART

One integrated circuit (IC) has output buffers to transmit data signals, for example, onto input/output (I/O) lines of a bus for reception by another IC coupled to the bus. The speed or frequency at which such signals may be reliably transmitted and received depends at least in part on the slew rate, that is the rate of voltage change, with which the signals are driven. An IC driving signals at too fast of a slew rate for a given bus frequency may introduce noise into the I/O lines and therefore limit the ability of a receiving IC to interpret the signals properly. An IC driving signals at too slow of a slew rate for a given bus frequency may also limit the ability of a receiving IC to interpret signals properly as changing signals may not sufficiently transition from one voltage level to another within the time period in which the receiving IC is to interpret signals.

Because the slew rate with which an output buffer drives signals can vary due to, for example, variations in process, supply voltage, and/or temperature (PVT variations) for the output buffer, IC's may be designed to drive signals at reduced frequencies to allow slew rates to vary and/or designed to control slew rates to help maintain them at substantially uniform levels in the presence of PVT variations. One IC controls output buffer slew rates by controlling resistances affecting slew rates relative to the known resistance of a resistor external to the IC.

SUMMARY

One disclosed method comprises identifying one or more times a delay of circuitry for an output buffer in generating a signal relative to an amount of time defined by a clock signal and controlling a slew rate of the circuitry for an output buffer in response to the identifying.

One disclosed method comprises detecting a rising signal edge generated by circuitry for an output buffer relative to a first edge of a clock signal, detecting a falling signal edge generated by the circuitry for an output buffer relative to a second edge of the clock signal, and controlling rising and falling signal edge slew rates of the circuitry for an output buffer in response to the detecting.

One disclosed apparatus comprises circuitry for an output buffer to generate a signal, an edge detector to receive a clock signal and the signal generated by the circuitry for an output buffer to identify one or more times a delay of the circuitry for an output buffer in generating the signal relative to an amount of time defined by the clock signal, and a slew rate control signal generator to generate one or more slew rate control signals to control a slew rate of the circuitry for an output buffer based on the identified delay.

One disclosed apparatus comprises circuitry for an output buffer to generate a signal, a rising edge detector to detect a rising edge of the signal generated by the circuitry for an output buffer relative to a first edge of a clock signal, a falling edge detector to detect a falling edge of the signal generated by the circuitry for an output buffer relative to a second edge of the clock signal, and a slew rate control signal generator to control rising and falling signal edge slew rates of the circuitry for an output buffer in response to the edge detections.

One disclosed apparatus comprises circuitry for an output buffer to generate a signal, means for identifying one or more times a delay of the circuitry for an output buffer in generating the signal relative to an amount of time defined by a clock signal, and means for controlling a slew rate of the circuitry for an output buffer.

One disclosed apparatus comprises circuitry for an output buffer to generate a signal, means for detecting rising and falling edges of the signal generated by the circuitry for an output buffer relative to edges of a clock signal, and means for controlling rising and falling signal edge slew rates of the circuitry for an output buffer.

One disclosed system comprises a bus comprising one or more lines, a clock source to generate a clock signal, and a plurality of devices coupled to the bus, wherein at least one device is coupled to the clock source and comprises one or more output buffers to output signals over one or more lines of the bus and a slew rate controller to identify one or more times a delay of circuitry for an output buffer in generating a signal relative to an amount of time defined using the clock signal and to control a slew rate of the circuitry for an output buffer and a slew rate of the one or more output buffers based on the identified delay.

One disclosed system comprises a bus comprising one or more lines, a clock source to generate a clock signal, and a plurality of devices coupled to the bus, wherein at least one device is coupled to the clock source and comprises one or more output buffers to output signals over one or more lines of the bus and a slew rate controller to detect rising and falling edges of a signal generated by circuitry for an output buffer relative to edges defined using the clock signal and to control rising and falling signal edge slew rates of the circuitry for an output buffer and rising and falling edge slew rates of the one or more output buffers based on the detections.

BRIEF DESCRIPTION OF DRAWINGS

One or more embodiments of the present invention are illustrated by way of example and not limitation in the figures of the accompanying drawings, in which like references indicate similar elements and in which:

FIG. 1 illustrates, for one embodiment, an example system comprising a device having output buffer slew rate control using a clock signal;

FIG. 2 illustrates, for one embodiment, a block diagram of circuitry for a device having output buffer slew rate control using a clock signal;

DETAILED DESCRIPTION

Figure 3:
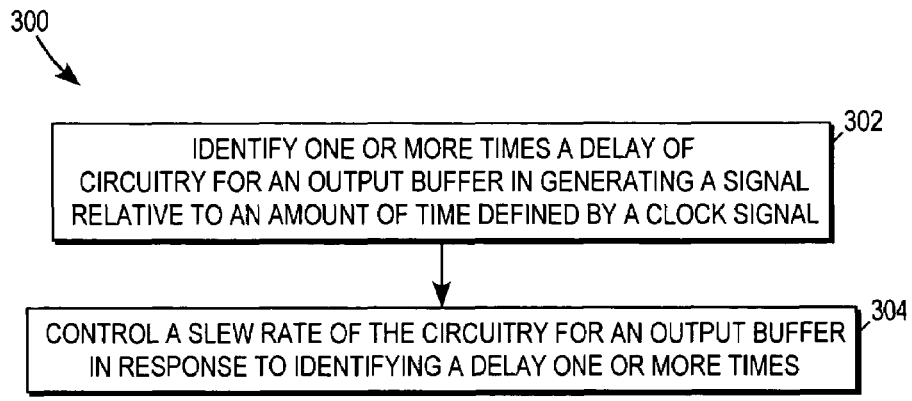
FIG. 3 illustrates, for one embodiment, a flow diagram to control a slew rate of circuitry for an output buffer using a clock signal.

FIG. 1 illustrates, for one embodiment, an example system 100 comprising a plurality of devices 110, 112, 114, 116, and 118 coupled to a bus 120. Device 110, 112, 114, 116, and/or 118 may comprise any suitable circuitry to perform any suitable one or more functions and may comprise any suitable circuitry to transmit signals onto one or more input/output (I/O) lines of bus 120 and/or to receive signals from one or more lines of bus 120 in any suitable manner.

Device 110 is coupled to receive a clock signal 103 from a clock source 102 and uses clock signal 103 to control a slew rate with which one or more output buffers of device 110 drive signals onto one or more lines of bus 120. Device 110 for one embodiment may use clock signal 103 to help identify whether a slew rate for an output buffer is slower or faster than desired for the bus clock frequency with which signals are to be driven onto bus 120. Relative to using an external resistor to control a slew rate by controlling a resistance affecting the slew rate relative to the resistance of the external resistor, device 110 for one embodiment may better control a slew rate using clock signal 103 as device 110 may identify how the slew rate responds to being controlled.

Clock source 102 may be any suitable clock source that generates and outputs clock signal 103 with any suitable frequency. Clock source 102 for one embodiment may generate and output clock signal 103 with a frequency substantially the same as the bus clock frequency with which device 110 is to drive signals onto one or more lines of bus 120. Clock source 102 for one embodiment may generate and output clock signal 103 with any suitable frequency that may be multiplied or divided to produce a clock signal with a frequency substantially the same as the bus clock frequency with which device 110 is to drive signals onto one or more lines of bus 120. Clock source 102 may generate and output clock signal 103 with any suitable duty cycle, such as with an approximately 50% duty cycle for example.

Clock source 102 for one embodiment may or may not be a system clock source. Clock source 102 for one embodiment may be coupled to generate and output clock signal 103 to device 112, 114, 116, and/or 118. Device 112, 114, 116, and/or 118 for one embodiment may also use clock signal 103 similarly as device 110 to control a slew rate with which one or more output buffers drive signals onto one or more lines of bus 120.

Device 110, 112, 114, 116, and/or 118 for one embodiment may comprise one or more integrated circuits and may or may not be mounted on the same circuit board with any other device 110, 112, 114, 116, and/or 118. Bus 120 may comprise any suitable number of one or more lines at each device 110, 112, 114, 116, and 118 and may be implemented using any suitable communications medium or media. Although illustrated in FIG. 1 as being configured with devices 112, 114, 116, and 118 in a multidrop or multipoint bus configuration to allow devices 110, 112, 114, 116, and/or 118 to communicate with one another over bus 120, device 110 may be configured with any suitable number of one or more devices in any suitable bus configuration.

Slew Rate Control Using Clock Signal

As illustrated in FIG. 2, device 110 for one embodiment may comprise circuitry 200. Circuitry 200 for one embodiment may comprise local clock signal generator 202, slew rate controller 210, and output buffers 221, 222, and 223.

Local clock signal generator 202 is coupled to receive clock signal 103 and to generate and output a local clock signal 203 in response to clock signal 103. Local clock signal generator 202 may comprise any suitable circuitry to generate and output local clock signal 203 with any suitable frequency, any suitable duty cycle, and any suitable phase relationship relative to clock signal 103.

Local clock signal generator 202 for one embodiment may generate and output local clock signal 203 with substantially the same frequency and duty cycle as clock signal 103. Local clock signal generator 202 for one embodiment may comprise, for example, a phase locked loop (PLL). Local clock signal generator 202 for another embodiment may multiply or divide clock signal 103 in any suitable manner to generate and output local clock signal 203 with any suitable frequency, any suitable duty cycle, and any suitable phase relationship relative to clock signal 103.

Local clock signal generator 202 for one embodiment may generate and output local clock signal 203 with a frequency substantially the same as the bus clock frequency with which device 110 is to drive signals onto one or more lines of bus 120. Local clock signal generator 202 for one embodiment may generate and output local clock signal 203 with, for example, an approximately 50% duty cycle.

Slew rate controller 210 is coupled to receive local clock signal 203 and generates one or more slew rate control signals 212 using local clock signal 203. Slew rate controller 210 for one embodiment may be coupled to output one or more slew rate control signals 212 to control a slew rate of output buffers 221, 222, and 223. Although illustrated as controlling a slew rate of three output buffers 221, 222, and 223, slew rate controller 210 may be coupled to control the slew rate of any suitable number of one or more output buffers.

Output buffers 221, 222, and 223 are each coupled to receive a data signal, for example, from other circuitry of device 110 and to drive a signal corresponding to the received data signal onto a respective line 121, 122, and 123 of bus 120. Although illustrated as having three output buffers 221, 222, and 223, device 110 may comprise any suitable number of one or more output buffers.

Slew rate controller 210 for one embodiment may identify how to control a slew rate of one or more output buffers in accordance with a flow diagram 300 of FIG. 3.

For block 302 of FIG. 3, slew rate controller 210 identifies one or more times a delay of circuitry for an output buffer in generating a signal relative to an amount of time defined by a clock signal. Slew rate controller 210 may identify a delay of any suitable circuitry for any suitable output buffer in generating any suitable signal relative to any suitable amount of time defined by any suitable clock signal.

Slew rate controller 210 for one embodiment for block 302 may identify a delay of the circuitry for an output buffer in generating a rising signal edge relative to an amount of time defined by a clock signal. Slew rate controller 210 for one embodiment for block 302 may identify a delay of the circuitry for an output buffer in generating a falling signal edge relative to an amount of time defined by a clock signal. Slew rate controller 210 for one embodiment for block 302 may identify a delay of the circuitry for an output buffer in generating a rising signal edge relative to an amount of time defined by a clock signal and a delay of the circuitry for an output buffer in generating a falling signal edge relative to an amount of time defined by the clock signal.

For block 304 of FIG. 3, slew rate controller 210 controls a slew rate of the circuitry for an output buffer in response to identifying a delay one or more times for block 302. Slew rate controller 210 may control a slew rate of the circuitry for an output buffer in any suitable manner in response to identifying a delay any suitable number of one or more times for block 302. Slew rate controller 210 for one embodiment may increase a slew rate if the identified delay is longer than desired one or more times and decrease a slew rate if the identified delay is shorter than desired one or more times.

Slew rate controller 210 for one embodiment may identify the delay for block 302 to help identify whether a slew rate of one or more output buffers is slower or faster than desired for the bus clock frequency with which signals are driven onto bus 120. Slew rate controller 210 may then control a slew rate of one or more output buffers to help set and maintain the slew rate at a desired level for the bus clock frequency with which signals are to be driven onto bus 120. Slew rate controller 210 for one embodiment may control the slew rate to help set and maintain the slew rate at or near a minimum allowable slew rate for the bus clock frequency with which signals are to be driven onto bus 120. Slew rate controller 210 for one embodiment may therefore help allow higher bus clock frequencies to be used with reduced or minimized concern for noise on signals associated with faster slew rates.

Figure 4:
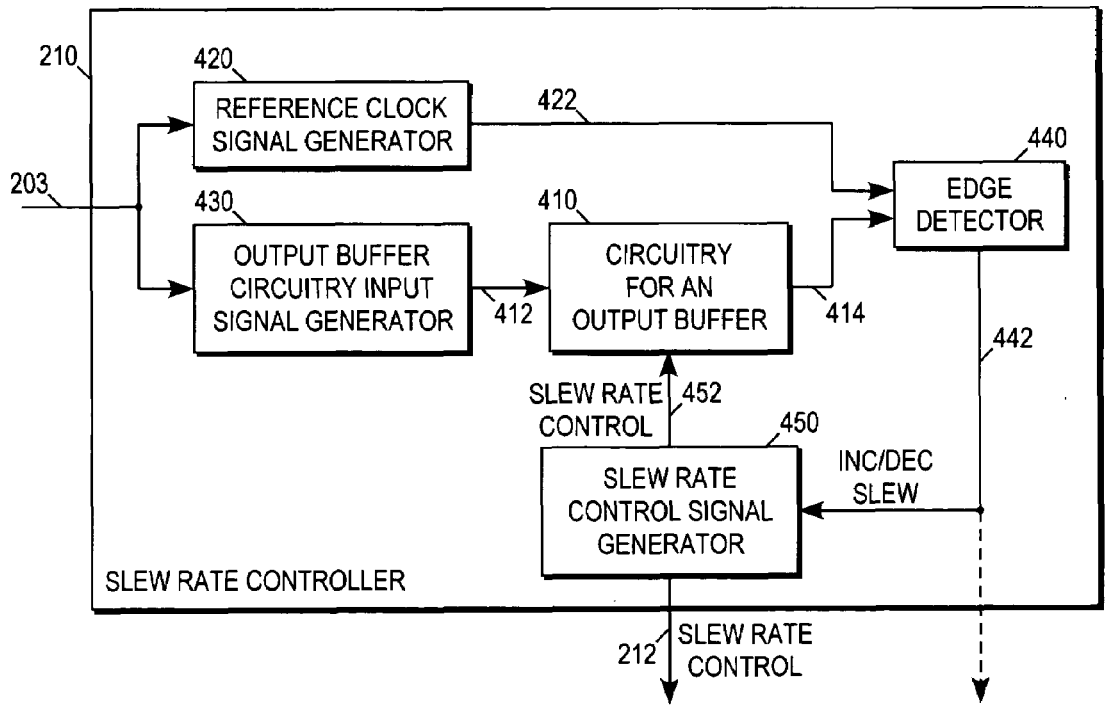
FIG. 4 illustrates, for one embodiment, a block diagram of a slew rate controller for the circuitry of FIG. 2.

Slew rate controller 210 may comprise any suitable circuitry to help identify how to control a slew rate of one or more output buffers in accordance with flow diagram 300 of FIG. 3. As illustrated in FIG. 4, slew rate controller 210 for one embodiment may comprise circuitry for an output buffer 410, a reference clock signal generator 420, an output buffer circuitry input signal generator 430, an edge detector 440, and a slew rate control signal generator 450.

Output buffer circuitry 410 may comprise any suitable circuitry that may be used for an output buffer. Output buffer circuitry 410 for one embodiment may comprise a dummy output buffer that does not drive any signals onto any line of bus 120 but rather is used by slew rate controller 210 to help identify how to control a slew rate of one or more output buffers exclusive of output buffer circuitry 410, such as output buffer 221, 222, and/or 223 of FIG. 2 for example. Output buffer circuitry 410 for one embodiment may comprise circuitry for only a portion of an output buffer to help identify how to control a slew rate of one or more output buffers exclusive of output buffer circuitry 410.

Output buffer circuitry 410 for another embodiment may comprise an output buffer and may be configured with suitable multiplexing circuitry, for example, to drive data signals, for example, onto a line of bus 120 for device 110 and to be used by slew rate controller 210 to help identify how to control a slew rate of such output buffer and/or one or more other output buffers, such as output buffer 221, 222, and/or 223 of FIG. 2 for example.

For one embodiment where output buffer circuitry 410 is used by slew rate controller 210 to help identify how to control a slew rate of one or more output buffers exclusive of output buffer circuitry 410, such as output buffer 221, 222, and/or 223 of FIG. 2 for example, output buffer circuitry 410 for one embodiment may comprise the same, substantially similar, or similar circuitry as such output buffer(s), may comprise a scaled version of the same, substantially similar, or similar circuitry as such output buffer(s), or may comprise the same, substantially similar, or similar circuitry for only a portion of such output buffer(s).

Figure 5:
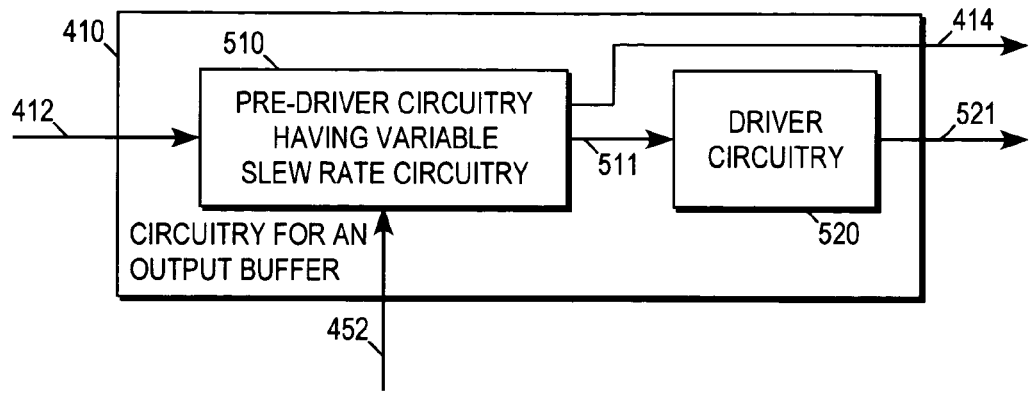
FIG. 5 illustrates, for one embodiment, a block diagram of circuitry for an output buffer for the slew rate controller of FIG. 4.

Output buffer circuitry 410 for one embodiment, as illustrated in FIG. 5, may comprise pre-driver circuitry 510 and driver circuitry 520. Pre-driver circuitry 510 is coupled to receive an input signal 412 and may comprise any suitable circuitry to generate and output any suitable pre-driver output signal 511 in response to input signal 412. Driver circuitry 520 is coupled to receive pre-driver output signal 511 and may comprise any suitable circuitry to generate and output any suitable output buffer output signal 521 in response to pre-driver output signal 511.

Pre-driver circuitry 510 is coupled to receive one or more slew rate control signals 452 and comprises variable slew rate circuitry that allows a slew rate of output buffer circuitry 410 to be set and controlled in response to one or more slew rate control signals 452. Pre-driver circuitry 510 may comprise any suitable variable slew rate circuitry. Pre-driver circuitry 510 for one embodiment may comprise suitable variable slew rate circuitry that controls pre-driver output signal 511 in controlling driver circuitry 520 to transition from one voltage level to another. Pre-driver circuitry 510 for one embodiment may generate an edge cycle completion signal 414 that helps drive pre-driver output signal 511 to a voltage level at or near its target voltage level in transitioning from one voltage level to another.

Output buffer circuitry 410 for another embodiment may comprise pre-driver circuitry 510 but not driver circuitry 520. For one embodiment, the node on which pre-driver output signal 511 is output may be coupled to a suitable load to help simulate the generation and output of pre-driver output signal 511 for an output buffer.

Figure 6:
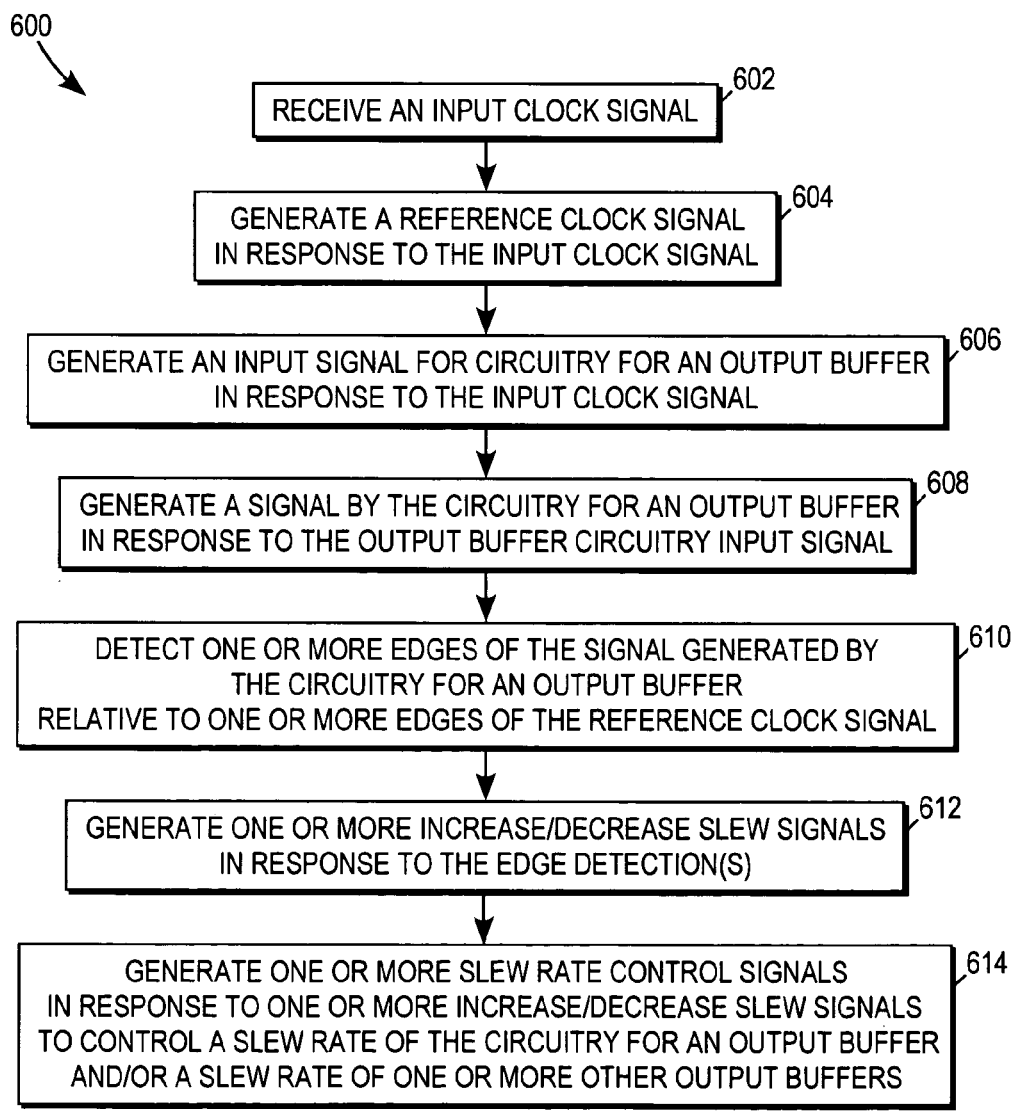
FIG. 6 illustrates, for one embodiment, a flow diagram to control a slew rate of circuitry for an output buffer and/or one or more other output buffers using a clock signal.

Slew rate controller 210 for one embodiment may use local clock signal 203 to control a slew rate of output buffer circuitry 410 and/or one or more output buffers exclusive of output buffer circuitry 410, such as output buffer 221, 222, and/or 223 for example, in accordance with a flow diagram 600 of FIG. 6.

For block 602 of FIG. 6, slew rate controller 210 receives an input clock signal. Slew rate controller 210 for one embodiment, as illustrated in FIG. 4, receives local clock signal 203. Slew rate controller 210 for another embodiment may receive clock signal 103 generated and output from clock source 102.

For block 604, reference clock signal generator 420 generates a reference clock signal 422 in response to the input clock signal received for block 602. Reference clock signal generator 420 for one embodiment, as illustrated in FIG. 4, may be coupled to receive local clock signal 203 and may comprise any suitable circuitry to generate and output, in response to local clock signal 203, any suitable reference clock signal 422 with any suitable frequency, any suitable duty cycle, and any suitable phase relationship relative to local clock signal 203. Reference clock signal generator 420 for one embodiment may invert local clock signal 203 to generate reference clock signal 422.

Slew rate controller 210 for another embodiment may use the input clock signal received for block 602 as reference clock signal 422. Slew rate controller 210 therefore may not comprise reference clock signal generator 420 and may not perform any operations for block 604.

For block 606, output buffer circuitry input signal generator 430 generates input signal 412 for output buffer circuitry 410 in response to the input clock signal received for block 602. Output buffer circuitry input signal generator 430 for one embodiment, as illustrated in FIG. 4, may be coupled to receive local clock signal 203 and may comprise any suitable circuitry to generate and output any suitable input signal 412 for output buffer circuitry 410 in response to local clock signal 203.

Output buffer circuitry input signal generator 430 for one embodiment may generate and output output buffer circuitry input signal 412 as a clock signal with any suitable frequency, any suitable duty cycle, and any suitable phase relationship relative to the input clock signal received for block 602. Output buffer circuitry input signal generator 430 for one embodiment may generate output buffer circuitry input signal 412 as a clock signal with a frequency approximately half as that of local clock signal 203 and with an approximately 50% duty cycle.

Slew rate controller 210 for another embodiment may input to output buffer circuitry 410 the input clock signal received for block 602 as output buffer circuitry input signal 412. Slew rate controller 210 therefore may not comprise output buffer circuitry input signal generator 430 and may not perform any operations for block 606.

For block 608, output buffer circuitry 410 generates a signal in response to output buffer circuitry input signal 412. Output buffer circuitry 410 may generate any suitable signal for block 608. Output buffer circuitry 410 for one embodiment may generate edge cycle completion signal 414 as the signal for block 608.

For block 610, edge detector 440 detects one or more edges of the signal generated by output buffer circuitry 410 for block 608 relative to one or more edges of reference clock signal 422. Edge detector 440 for one embodiment, as illustrated in FIG. 4, is coupled to receive edge cycle completion signal 414 and reference clock signal 422 and may comprise any suitable circuitry to detect any suitable edge of edge cycle completion signal 414 relative to any suitable edge of reference clock signal 422. Edge detector 440 for one embodiment may identify whether an edge of edge cycle completion signal 414 arrives prior to or after an edge of reference clock signal 422. Because both output buffer circuitry input signal 412 and reference clock signal 422 are generated from the input clock signal received for block 602, edge detector 440 may identify a delay of output buffer circuitry 410 in generating edge cycle completion signal 414 relative to an amount of time defined by the input clock signal received for block 602. Edge detector 440 may identify or interpret an edge of a signal in any suitable manner.

For block 612, edge detector 440 generates one or more increase/decrease slew signals 442 in response to the edge detection(s) for block 610. Edge detector 440 may comprise any suitable circuitry to generate and output any suitable one or more increase/decrease slew signals 442 in response to the edge detection(s) for block 610. Edge detector 440 for one embodiment may generate one or more suitable increase/decrease slew signals 442 to help increase a slew rate of output buffer circuitry 410 if edge detector 440 identifies one or more edges of edge cycle completion signal 414 arrive after one or more corresponding edges of reference clock signal 422. Edge detector 440 for one embodiment may generate one or more suitable increase/decrease slew signals 442 to help decrease a slew rate of output buffer circuitry 410 if edge detector 440 identifies one or more edges of edge cycle completion signal 414 arrive before one or more corresponding edges of reference clock signal 422.

For block 614, slew rate control signal generator 450 generates one or more slew rate control signals 452 in response to one or more increase/decrease slew signals 442 to control a slew rate of circuitry for an output buffer 410 and/or generates one or more slew rate control signals 212 in response to one or more increase/decrease slew signals 442 to control a slew rate of one or more other output buffers exclusive of output buffer circuitry 410, such as output buffer 221, 222, and/or 223 for example. Slew rate control signal generator 450 is coupled to receive one or more increase/decrease slew signals 442 and may comprise any suitable circuitry to generate and output any suitable one or more slew rate control signals 452 in response to one or more increase/decrease slew signals 442 to control a slew rate of circuitry for an output buffer 410 in any suitable manner. Slew rate control signal generator 450 may comprise any suitable circuitry to generate and output any suitable one or more slew rate control signals 212 in response to one or more increase/decrease slew signals 442 to control a slew rate of one or more other output buffers exclusive of output buffer circuitry 410 in any suitable manner. Slew rate control signal generator 450 for one embodiment may output one or more slew rate control signals 452 as one or more slew rate control signals 212.

Slew rate control signal generator 450 for one embodiment for block 614 may generate and output to output buffer circuitry 410 a multi-bit slew rate control code with each bit to activate or deactivate a respective one of a plurality of transistors coupled in parallel between the node at which pre-driver output signal 511 is generated and a power supply terminal. In this manner, slew rate control signal generator 450 may help control the resistance between the node at which pre-driver output signal 511 is generated and a power supply terminal and therefore help control a slew rate of output buffer circuitry 410.

Slew rate controller 210 for one embodiment may help control a slew rate of one or more output buffers exclusive of output buffer circuitry 410, such as output buffer 221, 222, and/or 223 for example, by outputting one or more increase/decrease slew signals 442 to one or more other slew rate control signal generators for one or more such output buffers.

Slew rate controller 210 may perform operations for blocks 602–614 in any suitable order and may or may not overlap in time the performance of any suitable operation with any other suitable operation. As one example, slew rate controller 210 for one embodiment may generally perform one or more operations for any block 602–614 as slew rate controller 210 performs one or more operations for any other block 602–614.

Figure 7:
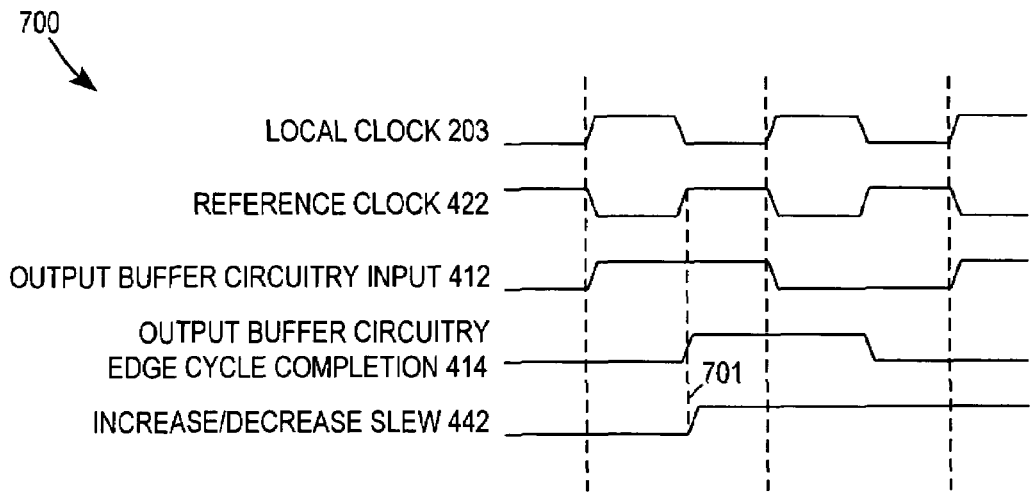
FIG. 7 illustrates, for one embodiment, an example signal timing diagram for the slew rate controller of FIG. 4.

FIG. 7 illustrates an example timing diagram 700 for one embodiment where slew rate controller 210 of FIG. 4 receives for block 602 local clock signal 203, generates for block 604 reference clock signal 422 by inverting local clock signal 203, generates for block 606 output buffer circuitry input signal 412 as a clock signal with a frequency approximately half as that as local clock signal 203, and generates for block 608 edge cycle completion signal 414. As illustrated in FIG. 7, slew rate controller 210 identifies a delay of output buffer circuitry 410 in generating edge cycle completion signal 414 relative to approximately one half clock cycle of local clock signal 203 by using edge detector 440 to detect a rising edge of edge cycle completion signal 414 relative to a corresponding rising edge of reference clock signal 422 at a time 701 of timing diagram 700. Because edge detector 440 identifies that the rising edge of edge cycle completion signal 414 in FIG. 7 arrives at edge detector 440 after a corresponding rising edge of reference clock signal 422, edge detector 440 generates a suitable increase/decrease slew signal 442 to help increase a slew rate of output buffer circuitry 410.

Rising and Falling Edge Slew Rate Control Using Clock Signal

Figure 8:
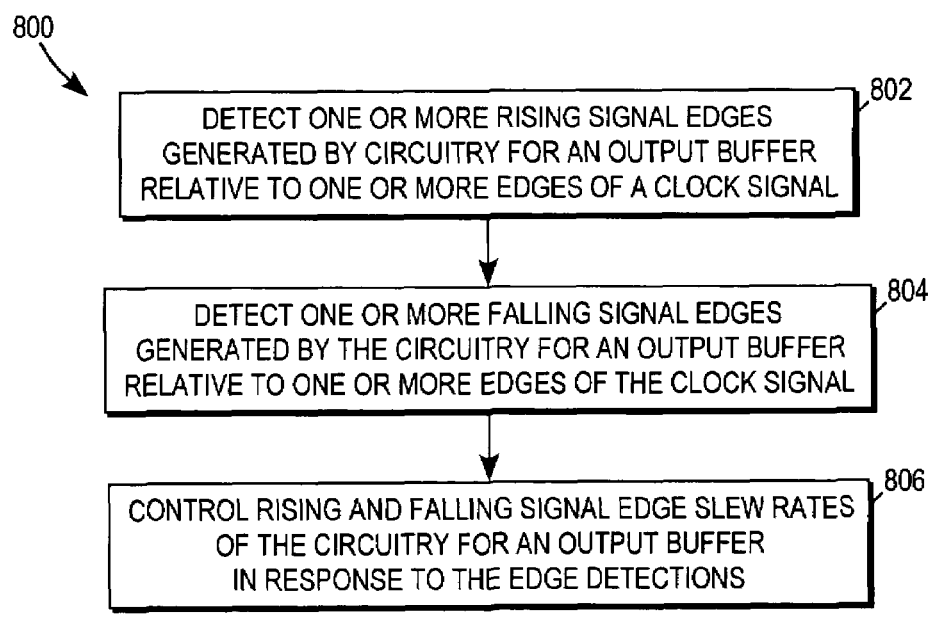
FIG. 8 illustrates, for one embodiment, a flow diagram to control a slew rate of circuitry for an output buffer using a clock signal.

Slew rate controller 210 for one embodiment may identify how to control a rising edge slew rate and a falling edge slew rate of one or more output buffers in accordance with a flow diagram 800 of FIG. 8.

For block 802 of FIG. 8, slew rate controller 210 detects one or more rising signal edges generated by circuitry for an output buffer relative to one or more edges of a clock signal. Slew rate controller 210 may detect any suitable one or more rising signal edges generated by any suitable circuitry for any suitable output buffer relative to any suitable one or more edges of any suitable clock signal.

For block 804, slew rate controller 210 detects one or more falling signal edges generated by circuitry for an output buffer relative to one or more edges of the clock signal. Slew rate controller 210 may detect any suitable one or more falling signal edges generated by any suitable circuitry for any suitable output buffer relative to any suitable one or more edges of any suitable clock signal.

For block 806, slew rate controller 210 controls rising and falling signal edge slew rates of the circuitry for an output buffer in response to the edge detections. Slew rate controller 210 may control rising and falling signal edge slew rates of the circuitry for an output buffer in any suitable manner in response to the edge detections for blocks 802 and 804.

Slew rate controller 210 for one embodiment may increase a rising edge slew rate if one or more rising signal edges generated by circuitry for an output buffer are slower than one or more corresponding edges of a clock signal. Slew rate controller 210 for one embodiment may decrease a rising edge slew rate if one or more rising signal edges generated by circuitry for an output buffer are faster than one or more corresponding edges of a clock signal.

Slew rate controller 210 for one embodiment may increase a falling edge slew rate if one or more falling signal edges generated by circuitry for an output buffer are slower than one or more corresponding edges of a clock signal. Slew rate controller 210 for one embodiment may decrease a falling edge slew rate if one or more falling signal edges generated by circuitry for an output buffer are faster than one or more corresponding edges of a clock signal.

Slew rate controller 210 for one embodiment may help identify whether a rising edge slew rate and a falling edge slew rate for one or more output buffers is slower or faster than desired for the bus clock frequency with which signals are driven onto bus 120. Slew rate controller 210 may then control the rising edge slew rate and the falling edge slew rate to help set and maintain both slew rates at desired levels for the bus clock frequency with which signals are to be driven onto bus 120. Slew rate controller 210 for one embodiment may help allow one or more output buffers to drive signals onto bus 120 on both rising and falling edges of a clock signal defining the bus clock frequency, and therefore help allow one or more output buffers drive signals onto bus 120 at a data rate twice the frequency of the bus clock frequency, with reduced or minimized concern for receiving errors due to slower slew rates and for noise on signals associated with faster slew rates. Slew rate controller 210 for one embodiment may control both rising edge and falling edge slew rates to help set and maintain the slew rates at or near minimum allowable slew rates for the bus clock frequency with which signals are to be driven onto bus 120. Slew rate controller 210 for one embodiment may therefore help allow higher bus clock frequencies to be used with reduced or minimized concern for noise on signals associated with faster slew rates.

Slew rate controller 210 may comprise any suitable circuitry to help identify how to control a rising edge slew rate and a falling edge slew rate of one or more output buffers in accordance with flow diagram 800 of FIG. 8. Slew rate controller 210 for one embodiment may comprise circuitry as illustrated in FIG. 4. Slew rate controller 210 for one embodiment, as illustrated in FIG. 9, may comprise circuitry for an output buffer 910, driver 916, inverter 918, inverter 920, flip-flop 930, edge detectors 940 and 945, rising slew rate control signal generator 950, falling slew rate control signal generator 955, and edge sample clock signal generator 960.

Figure 9:
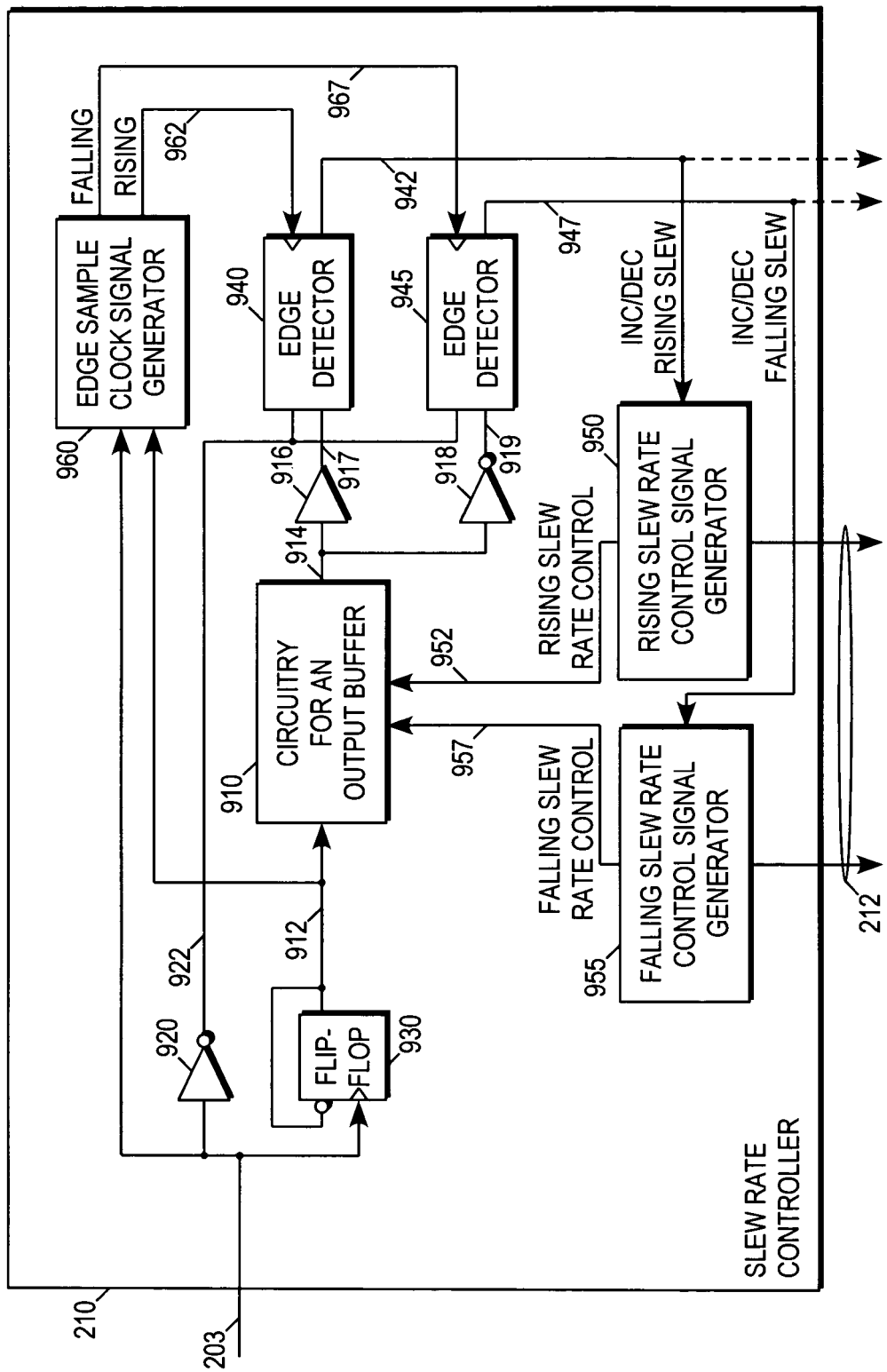
FIG. 9 illustrates, for one embodiment, a block diagram of a slew rate controller for the circuitry of FIG. 2.

The description of the circuitry for slew rate controller 210 of FIG. 4 is generally applicable to the circuitry of FIG. 9, noting that output buffer circuitry 910, inverter 920, and flip-flop 930 generally correspond to output buffer circuitry 410, reference clock signal generator 420, and output buffer circuitry input signal generator 430, respectively, of FIG. 4; that driver 916, inverter 918, and edge detectors 940 and 945 generally correspond to edge detector 440 of FIG. 4; and that rising slew rate control signal generator 950 and falling slew rate control signal generator 955 generally correspond to slew rate control signal generator 450 of FIG. 4.

Output buffer circuitry 910 has variable slew rate circuitry to help allow both a rising edge slew rate and a falling edge slew rate to be controlled. Output buffer circuitry 910 may comprise any suitable circuitry having any suitable variable slew rate circuitry to allow both a rising edge slew rate and a falling edge slew rate to be controlled.

Figure 10:
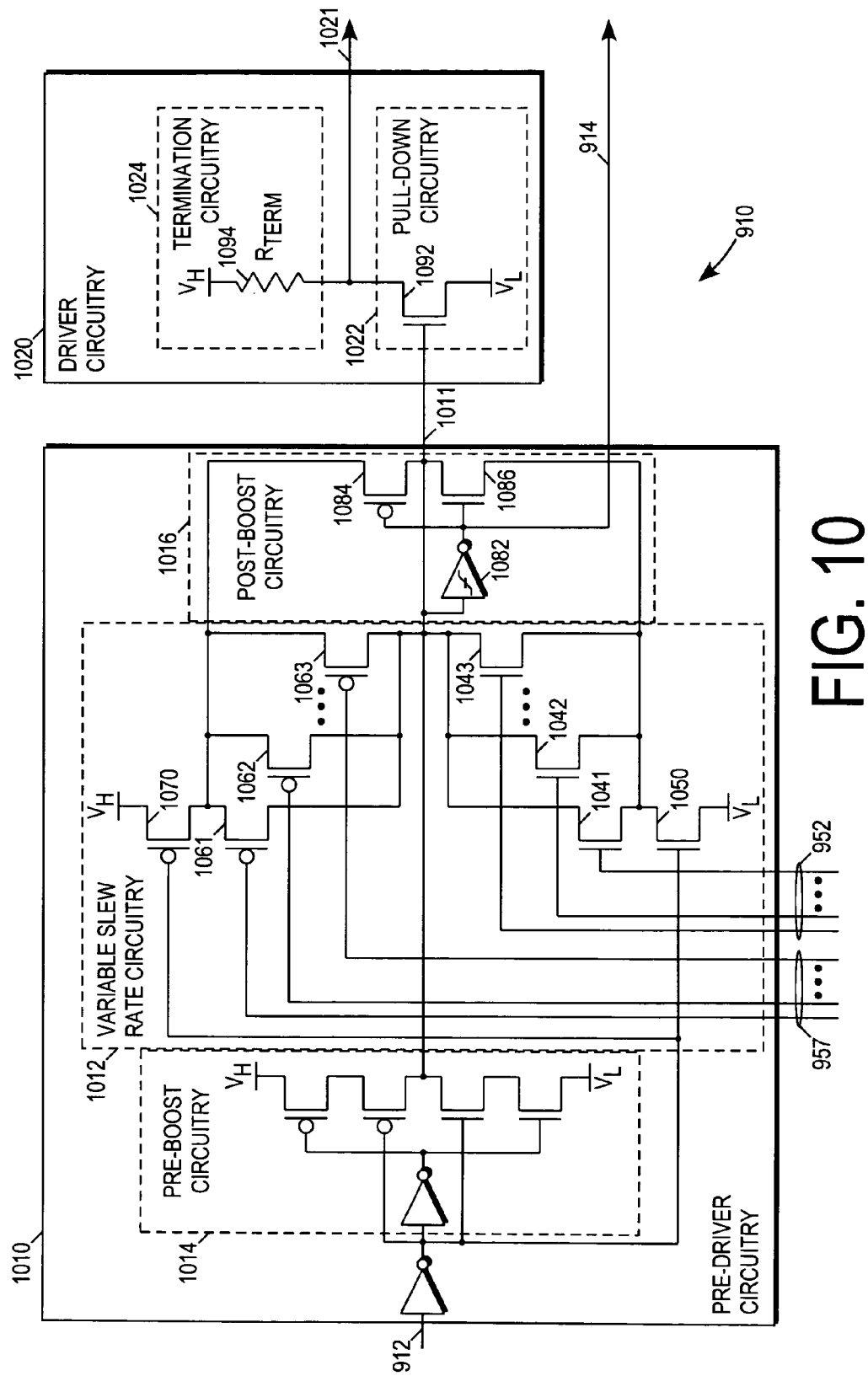
FIG. 10 illustrates, for one embodiment, circuitry for an output buffer for the slew rate controller of FIG. 9.

Output buffer circuitry 910 for one embodiment, as illustrated in FIG. 10, comprises pre-driver circuitry 1010 and driver circuitry 1020. Pre-driver circuitry 1010 is coupled to receive an input signal 912 and generates and outputs a pre-driver output signal 1011 in response to input signal 912. Driver circuitry 1020 is coupled to receive pre-driver output signal 1011 and generates and outputs an output buffer output signal 1021 in response to pre-driver output signal 1011. For one embodiment as illustrated in FIG. 10, pre-driver circuitry 1010 generates and outputs pre-driver output signal 1011 with a relatively higher voltage level in response to input signal 912 having a relatively higher voltage level, and driver circuitry 1020 generates and outputs output buffer output signal 1021 with a relatively lower voltage level in response to pre-driver output signal 1011 having a relatively higher voltage level. Also, pre-driver circuitry 1010 generates and outputs pre-driver output signal 1011 with a relatively lower voltage level in response to input signal 912 having a relatively lower voltage level, and driver circuitry 1020 generates and outputs output buffer output signal 1021 with a relatively higher voltage level in response to pre-driver output signal 1011 having a relatively lower voltage level.

Pre-driver circuitry 1010 for one embodiment, as illustrated in FIG. 10, comprises variable slew rate circuitry 1012, pre-boost circuitry 1014, and post-boost circuitry 1016 coupled to the node on which pre-driver output signal 1011 is generated.

Variable slew rate circuitry 1012 for one embodiment, as illustrated in FIG. 10, comprises a plurality of n-channel field effect transistors (n-FETs), such as n-FETs 1041, 1042, and 1043 for example, coupled in parallel between the node on which pre-driver output signal 1011 is generated and a lower voltage supply terminal $V_L$, such as a ground terminal for example. The gates of the n-FETs are coupled to receive rising slew rate control signals 952 to allow one or more n-FETs to be selectively activated. When the node on which pre-driver output signal 1011 is generated is pulled-down to the lower voltage supply terminal $V_L$ by another n-FET 1050 in response to input signal 912, the resistance between that node and the lower voltage supply terminal $V_L$ may therefore be controlled to help set and control a falling edge slew rate of pre-driver output signal 1011 and therefore a rising edge slew rate of output buffer output signal 1021. Variable slew rate circuitry 1012 may comprise any suitable number of n-FETs of any suitable size(s) to help allow a rising edge slew rate of output buffer circuitry 910 to be controlled.

Variable slew rate circuitry 1012 for another embodiment may comprise any other suitable circuitry to help allow a rising edge slew rate of output buffer circuitry 910 to be controlled in any suitable manner.

Variable slew rate circuitry 1012 for one embodiment, as illustrated in FIG. 10, comprises a plurality of p-channel field effect transistors (p-FETs), such as p-FETs 1061, 1062, and 1063 for example, coupled in parallel between the node on which pre-driver output signal 1011 is generated and a higher voltage supply terminal $V_H$, such as a termination voltage supply terminal for example. The gates of the p-FETs are coupled to receive falling slew rate control signals 957 to allow one or more p-FETs to be selectively activated. When the node on which pre-driver output signal 1011 is generated is pulled-up to the higher voltage supply terminal $V_H$ by another p-FET 1070 in response to input signal 912, the resistance between that node and the higher voltage supply terminal $V_H$ may therefore be controlled to help set and control a rising edge slew rate of pre-driver output signal 1011 and therefore a falling edge slew rate of output buffer output signal 1021. Variable slew rate circuitry 1012 may comprise any suitable number of p-FETs of any suitable size(s) to help allow a falling edge slew rate of output buffer circuitry 910 to be controlled.

Variable slew rate circuitry 1012 for another embodiment may comprise any other suitable circuitry to help allow a falling edge slew rate of output buffer circuitry 910 to be controlled in any suitable manner.

Pre-boost circuitry 1014 for one embodiment may help provide an initial, relatively fast transition for pre-driver output signal 1011 from a lower voltage level to a suitable intermediate voltage level in transitioning pre-driver output signal 1011 from the lower voltage level to a higher voltage level in response to input signal 912. Pre-boost circuitry 1014 may also help provide an initial, relatively fast transition for pre-driver output signal 1011 from a higher voltage level to a suitable intermediate voltage level in transitioning pre-driver output signal 1011 from the higher voltage level to a lower voltage level in response to input signal 912.

Pre-boost circuitry 1014 for one embodiment may comprise the circuitry illustrated in FIG. 10. Pre-boost circuitry 1014 for another embodiment may comprise any other suitable circuitry to help provide initial, relatively fast transitions for pre-driver output signal 1011 in any suitable manner. Pre-driver circuitry 1010 for one embodiment may not comprise pre-boost circuitry 1014.

Post-boost circuitry 1016 for one embodiment may help provide a final, relatively fast transition for pre-driver output signal 1011 from a suitable intermediate voltage level to a higher voltage level in transitioning pre-driver output signal 1011 from a lower voltage level to the higher voltage level in response to input signal 912. Post-boost circuitry 1016 may also help provide a final, relatively fast transition for pre-driver output signal 1011 from a suitable intermediate voltage level to a lower voltage level in transitioning pre-driver output signal 1011 from a higher voltage level to the lower voltage level in response to input signal 912.

Post-boost circuitry 1016 for one embodiment, as illustrated in FIG. 10, may comprise a hysteresis inverter 1082 coupled to receive the signal on the node on which pre-driver output signal 1011 is generated. Hysteresis inverter 1082 generates and outputs an edge cycle completion signal 914 to drive a p-FET 1084 coupled in parallel with the falling edge slew rate control p-FETs of variable slew rate circuitry 1012 to help drive pre-driver output signal 1011 to a voltage level at or near its target voltage level in transitioning from a lower voltage level to a higher voltage level. Hysteresis inverter 1082 also generates and outputs edge cycle completion signal 914 to drive an n-FET 1086 coupled in parallel with the rising edge slew rate control n-FETs of variable slew rate circuitry 1012 to help drive pre-driver output signal 1011 to a voltage level at or near its target voltage level in transitioning from a higher voltage level to a lower voltage level.

Post-boost circuitry 1016 for another embodiment may comprise any other suitable circuitry to generate any suitable edge cycle completion signal 914 to help drive pre-driver output signal 1011 to a voltage level at or near its target voltage level in transitioning from one voltage level to another. Post-boost circuitry 1016 for another embodiment may comprise any other suitable circuitry to generate any suitable edge cycle completion signal 914 to help provide final, relatively fast transitions for pre-driver output signal 1011 in any suitable manner.

Driver circuitry 1020 for one embodiment, as illustrated in FIG. 10, comprises pull-down circuitry 1022 and termination circuitry 1024.

Pull-down circuitry 1022 for one embodiment, as illustrated in FIG. 10, comprises a pull-down n-channel field effect transistor (n-FET) 1092 coupled between the node on which output buffer output signal 1021 is generated and a lower voltage supply terminal $V_L$, such as a ground terminal for example. The gate of n-FET 1092 is coupled to receive pre-driver output signal 1011. When n-FET 1092 is activated in response to pre-driver output signal 1011, n-FET 1092 pulls the node on which output buffer output signal 1021 is generated to a lower voltage level. When n-FET 1092 is deactivated in response to pre-driver output signal 1011, n-FET 1092 allows termination circuitry 1024 to pull the node on which output buffer output signal 1021 is generated to a higher voltage level.

Termination circuitry 1024 for one embodiment, as illustrated in FIG. 10, comprises circuitry defining a resistor 1094 having a resistance $R_{TERM}$ between the node on which output buffer output signal 1021 is generated and a higher voltage supply terminal $V_H$, such as a termination voltage supply terminal for example. Termination circuitry 1024 for one embodiment may comprise suitable circuitry to allow the resistance $R_{TERM}$ to be controlled, for example, to compensate for process, supply voltage, and/or temperature (PVT) variations.

Driver circuitry 1020 for another embodiment may comprise any other suitable circuitry to generate and output any suitable output buffer output signal 1021 in response to pre-driver output signal 1011.

Output buffer circuitry 910 for another embodiment may comprise pre-driver circuitry 1010 but not driver circuitry 1020. For one embodiment, the node on which pre-driver output signal 1011 is output may be coupled to a suitable load to help simulate the generation and output of pre-driver output signal 1011 for an output buffer.

To identify how to control a rising edge slew rate and a falling edge slew rate of output buffer circuitry 910, slew rate controller 210 of FIG. 9 receives local clock signal 203 to generate a reference clock signal 922 using inverter 920 and to generate an output buffer circuitry input signal 912 using flip-flop 930. Flip-flop 930 has a non-inverting output terminal coupled to an inverting input terminal of flip-flop 930 and is clocked by local clock signal 203 to generate and output output buffer circuitry input signal 912 as a clock signal with a frequency approximately half as that of local clock signal 203. Although described in connection with receiving local clock signal 203 and using inverter 920 and flip-flop 930, slew rate controller 210 of FIG. 9 may receive or generate any suitable reference clock signal 922 in any suitable manner and may receive or generate any suitable output buffer circuitry input signal 912 in any suitable manner.

Driver 916 is coupled to receive edge cycle completion signal 914 and generates and outputs a rising edge cycle completion signal 917. Edge detector 940 is coupled to receive rising edge cycle completion signal 917, reference clock signal 922, and a rising edge sample clock signal 962 and may comprise any suitable circuitry to help detect one or more rising edges of edge cycle completion signal 914 relative to one or more edges of reference clock signal 922 in any suitable manner in response to rising edge sample clock signal 962 and to generate and output any suitable one or more increase/decrease rising slew signals 942 in response to such edge detection(s) to help increase or decrease a rising slew rate of output buffer circuitry 910 based on such edge detection(s).

Edge detector 940 for another embodiment may be coupled to receive edge cycle completion signal 914 directly. Slew rate controller 210 of FIG. 9 for another embodiment may therefore not comprise driver 916.

Inverter 918 is coupled to receive edge cycle completion signal 914 and generates and outputs a falling edge cycle completion signal 919. Edge detector 945 is coupled to receive falling edge cycle completion signal 919, reference clock signal 922, and a falling edge sample clock signal 967 and may comprise any suitable circuitry to help detect one or more falling edges of edge cycle completion signal 914 relative to one or more edges of reference clock signal 922 in any suitable manner in response to falling edge sample clock signal 967 and to generate and output any suitable one or more increase/decrease falling slew signals 947 in response to such edge detection(s) to help increase or decrease a falling slew rate of output buffer circuitry 910 based on such edge detection(s).

Edge detector 945 for another embodiment may be coupled to receive edge cycle completion signal 914 directly and may comprise any suitable circuitry to help detect one or more falling edges of edge cycle completion signal 914 relative to one or more edges of reference clock signal 922 in any suitable manner. Slew rate controller 210 of FIG. 9 for another embodiment may therefore not comprise inverter 918.

Edge sample clock signal generator 960 is coupled to receive local clock signal 203 and may comprise any suitable circuitry to generate and output any suitable rising edge sample clock signal 962 in response to local clock signal 203 to help edge detector 940 identify when to compare rising edge cycle completion signal 917 to reference clock signal 922. Edge sample clock signal generator 960 may also comprise any suitable circuitry to generate and output any suitable falling edge sample clock signal 967 in response to local clock signal 203 to help edge detector 945 identify when to compare falling edge cycle completion signal 919 to reference clock signal 922. Edge sample clock signal generator 960 for one embodiment may be coupled to receive output buffer circuitry input signal 912 to help identify when to generate rising edge sample clock signal 962 and falling edge sample clock signal 967.

Rising slew rate control signal generator 950 is coupled to receive one or more increase/decrease rising slew signals 942 and may comprise any suitable circuitry to generate and output any suitable one or more rising slew rate control signals 952 in response to one or more increase/decrease rising slew signals 942 to help control a rising slew rate of circuitry for an output buffer 910 in any suitable manner. Rising slew rate control signal generator 950 may comprise any suitable circuitry to generate and output any suitable one or more slew rate control signals 212 in response to one or more increase/decrease rising slew signals 942 to help control a rising slew rate of one or more other output buffers exclusive of output buffer circuitry 910, such as output buffer 221, 222, and/or 223 for example, in any suitable manner. Rising slew rate control signal generator 950 for one embodiment may output one or more rising slew rate control signals 952 as one or more slew rate control signals 212.

Falling slew rate control signal generator 955 is coupled to receive one or more increase/decrease falling slew signals 947 and may comprise any suitable circuitry to generate and output any suitable one or more falling slew rate control signals 957 in response to one or more increase/decrease falling slew signals 947 to help control a falling slew rate of circuitry for an output buffer 910 in any suitable manner. Falling slew rate control signal generator 955 may comprise any suitable circuitry to generate and output any suitable one or more slew rate control signals 212 in response to one or more increase/decrease falling slew signals 947 to help control a falling slew rate of one or more other output buffers exclusive of output buffer circuitry 910, such as output buffer 221, 222, and/or 223 for example, in any suitable manner. Falling slew rate control signal generator 955 for one embodiment may output one or more falling slew rate control signals 957 as one or more slew rate control signals 212.

Slew rate controller 210 of FIG. 9 for one embodiment may help control a rising and/or falling slew rate of one or more output buffers exclusive of output buffer circuitry 910, such as output buffer 221, 222, and/or 223 for example, by outputting one or more increase/decrease rising slew signals 942 and/or one or more increase/decrease falling slew signals 947 to one or more other slew rate control signal generators for one or more such output buffers.

Figure 11:
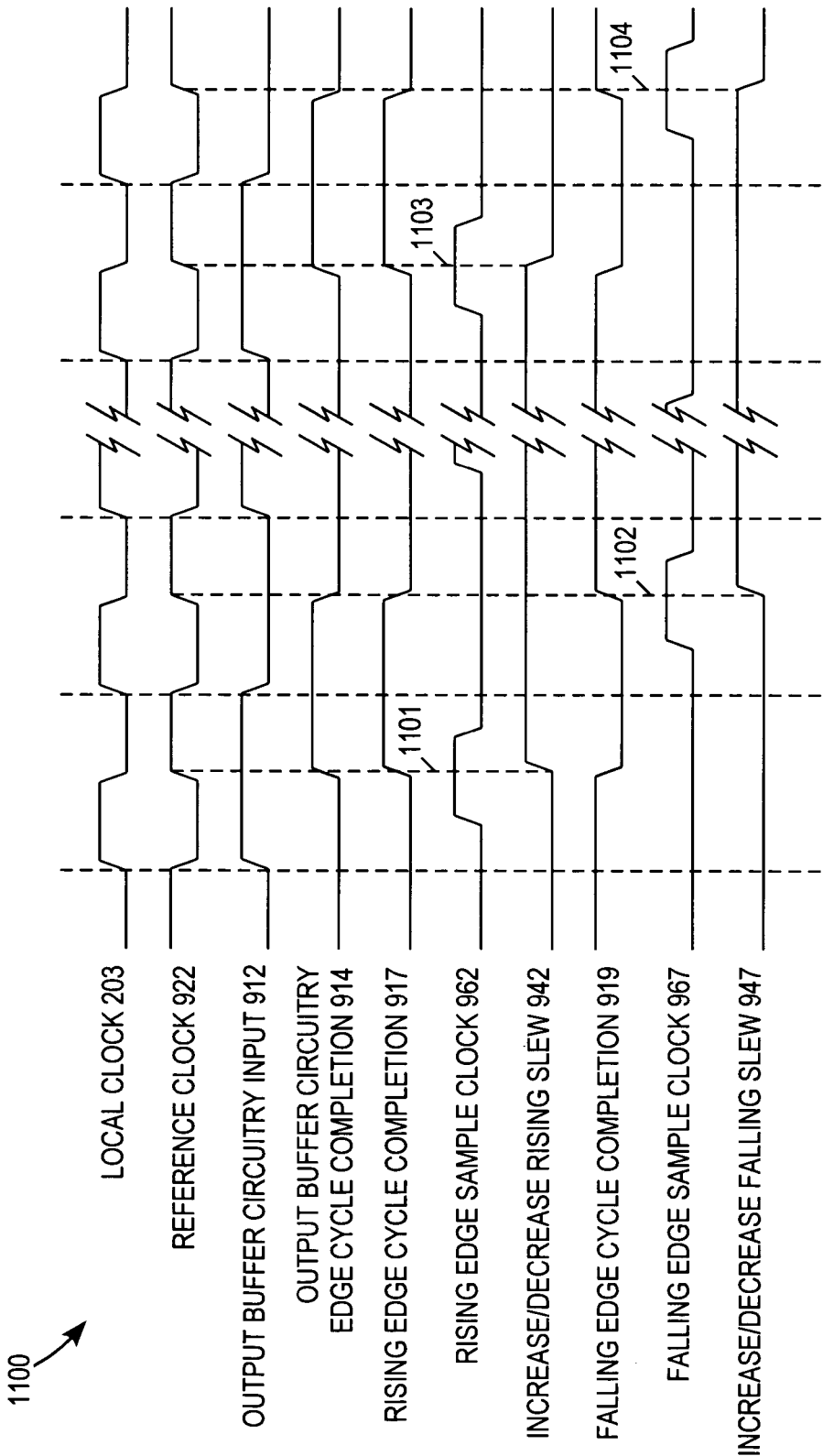
FIG. 11 illustrates, for one embodiment, an example signal timing diagram for the slew rate controller of FIG. 9.

FIG. 11 illustrates an example timing diagram 1100 for one embodiment where slew rate controller 210 comprises the circuitry of FIG. 9. As illustrated in FIG. 11, slew rate controller 210 uses edge detector 940 to detect a rising edge of rising edge cycle completion signal 917 relative to a corresponding rising edge of reference clock signal 922 in response to rising edge sample clock signal 962. At time 1101 in timing diagram 1100, edge detector 940 identifies that the rising edge of rising edge cycle completion signal 917 arrives at edge detector 940 after a corresponding rising edge of reference clock signal 922. Edge detector 940 then generates a suitable increase/decrease rising slew signal 942 to help increase a rising slew rate of output buffer circuitry 910. At time 1103 in timing diagram 1100, edge detector 940 identifies that the rising edge of rising edge cycle completion signal 917 arrives at edge detector 940 before a corresponding rising edge of reference clock signal 922. Edge detector 940 then generates a suitable increase/decrease rising slew signal 942 to help decrease a rising slew rate of output buffer circuitry 910.

Slew rate controller 210 also uses edge detector 945 to detect a rising edge of falling edge cycle completion signal 919 relative to a corresponding rising edge of reference clock signal 922 in response to falling edge sample clock signal 967. At time 1102 in timing diagram 1100, edge detector 945 identifies that the rising edge of falling edge cycle completion signal 919 arrives at edge detector 940 after a corresponding rising edge of reference clock signal 922. Edge detector 945 then generates a suitable increase/decrease falling slew signal 947 to help increase a falling slew rate of output buffer circuitry 910. At time 1104 in timing diagram 1100, edge detector 945 identifies that the rising edge of falling edge cycle completion signal 919 arrives at edge detector 945 before a corresponding rising edge of reference clock signal 922. Edge detector 945 then generates a suitable increase/decrease falling slew signal 947 to help decrease a falling slew rate of output buffer circuitry 910.

Slew Rate Control Signal Generator

Slew rate control signal generator 450 of FIG. 4, rising slew rate control signal generator 950 of FIG. 9, and/or falling slew rate control signal generator 955 of FIG. 9 for one embodiment may optionally comprise a digital filter to help avoid mistakenly controlling a slew rate in response to noise in slew rate controller 210.

Slew rate control signal generator 450 of FIG. 4, rising slew rate control signal generator 950 of FIG. 9, and/or falling slew rate control signal generator 955 of FIG. 9 for one embodiment may optionally comprise a dither controller to help avoid generating noise resulting from repeatedly generating one or more slew rate control signals to increase and then decrease a slew rate above and below a desired slew rate.

Figure 12:
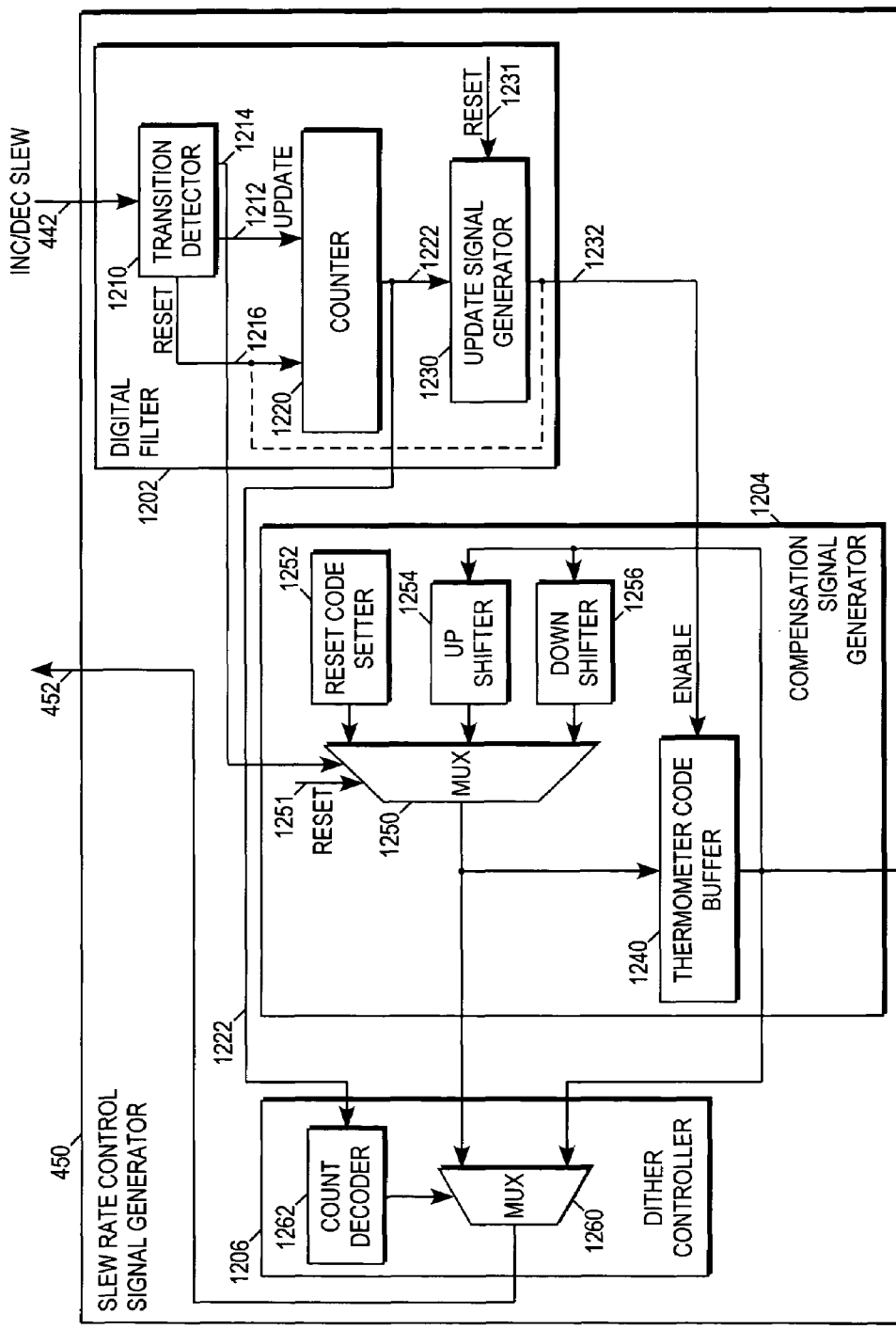
FIG. 12 illustrates, for one embodiment, a block diagram of a slew rate control signal generator.

As illustrated in FIG. 12, slew rate control signal generator 450 for one embodiment may comprise circuitry to implement a digital filter 1202, a compensation signal generator 1204, and a dither controller 1206. Although described in connection with slew rate control signal generator 450, the circuitry of FIG. 12 for one embodiment may similarly be used for rising slew rate control signal generator 950 and/or falling slew rate control signal generator 955 of FIG. 9.

Digital filter 1202 is coupled to receive a sequence of increase/decrease slew signals 442 and may comprise any suitable circuitry to help filter such signals to help avoid mistakenly controlling a slew rate in response to noise in slew rate controller 210. Digital filter 1202 for one embodiment, as illustrated in FIG. 12, may comprise circuitry to implement a transition detector 1210, a counter 1220, and an update signal generator 1230.

Transition detector 1210 is coupled to receive the sequence of increase/decrease slew signals 442 and may comprise any suitable circuitry to identify in any suitable manner when such signals transition from an increase state to a decrease state and/or from the decrease state to the increase state. Transition detector 1210 for one embodiment, as illustrated in FIG. 12, may be coupled to output a suitable counter update signal 1212 in response to a received increase/decrease slew signal 442. Transition detector 1210 for one embodiment may output a received increase/decrease slew signal 442 as a signal 1214.

Counter 1220 is coupled to receive counter update signals 1212 and a reset signal 1216 and may comprise any suitable circuitry to update a count in any suitable manner in response to counter update signals 1212, to reset its count in response to reset signal 1216, and to output any suitable one or more signals 1222 representative of its count.

Transition detector 1210 for one embodiment may generate and output reset signal 1216 to reset counter 1220 when transition detector 1210 receives an increase/decrease slew signal 442 having a value different than a just prior received increase/decrease slew signal 442. In this manner, counter 1220 may then count consecutively received increase/decrease slew signals 442 having a same value.

Update signal generator 1230 is coupled to receive one or more signals 1222 from counter 1220 and may comprise any suitable circuitry to decode the count maintained by counter 1220 in any suitable manner to generate and output any suitable one or more update signals 1232 to compensation signal generator 1204 when the count satisfies one or more conditions, such as reaching or exceeding a predetermined number for example.

Compensation signal generator 1204 may comprise any suitable circuitry to generate and output any suitable one or more slew rate control signals 212 in any suitable manner. Compensation signal generator 1204 is coupled to receive one or more update signals 1232 and may comprise any suitable circuitry to increase or decrease a slew rate controlled by slew rate control signal(s) 212 in any suitable manner in response to update signal(s) 1232.

For one embodiment where update signal generator 1230 generates and outputs one or more update signals 1232 when counter 1220 counts at least a predetermined number of consecutive increase/decrease slew signals 442 having a same value, digital filter 1202 helps avoid mistakenly controlling a slew rate in response to noise in slew rate controller 210 by controlling the slew rate only in response to at least the predetermined number of consecutive edge detection results identifying the same relative condition to help ensure such results were not due to noise. Digital filter 1202 may condition controlling the slew rate in response to any suitable predetermined number, such as thirty-two for example, of consecutive increase/decrease slew signals 442 having the same value.

Update signal generator 1230 for one embodiment may optionally be coupled to reset counter 1220 when the count satisfies one or more conditions, such as reaching or exceeding a predetermined number for example, to restart counting for a next increase or decrease of slew rate. For another embodiment, counter 1220 may automatically reset its count, for example, by rolling over its count in response to receiving a suitable predetermined number of counter update signals 1212, such as thirty-two for example, in the absence of any reset signal 1216.

Transition detector 1210 for one embodiment may comprise any suitable circuitry to help filter in any suitable manner one or more increase/decrease slew signals 442 having a value resulting from noise in slew rate controller 210 in an otherwise consecutive sequence of increase/decrease slew signals 442 having the same value. In this manner, digital filter 1202 may help better control a slew rate in the presence of noise by controlling the slew rate in response to a sequence of edge detection results identifying the same relative condition despite one or more glitches in the sequence.

Transition detector 1210 for one embodiment may comprise any suitable circuitry to help identify a plurality of first increase/decrease slew signals 442 of a same value having no more than a predetermined number of one or more second increase/decrease slew signals 442 of a different value between any two first increase/decrease slew signals 442 in the plurality. Transition detector 1210 for one embodiment may ignore such different-valued increase/decrease slew signals 442. Transition detector 1210 for one embodiment may treat such different-valued increase/decrease slew signals 442 as same-valued increase/decrease slew signals 442.

Figure 13:
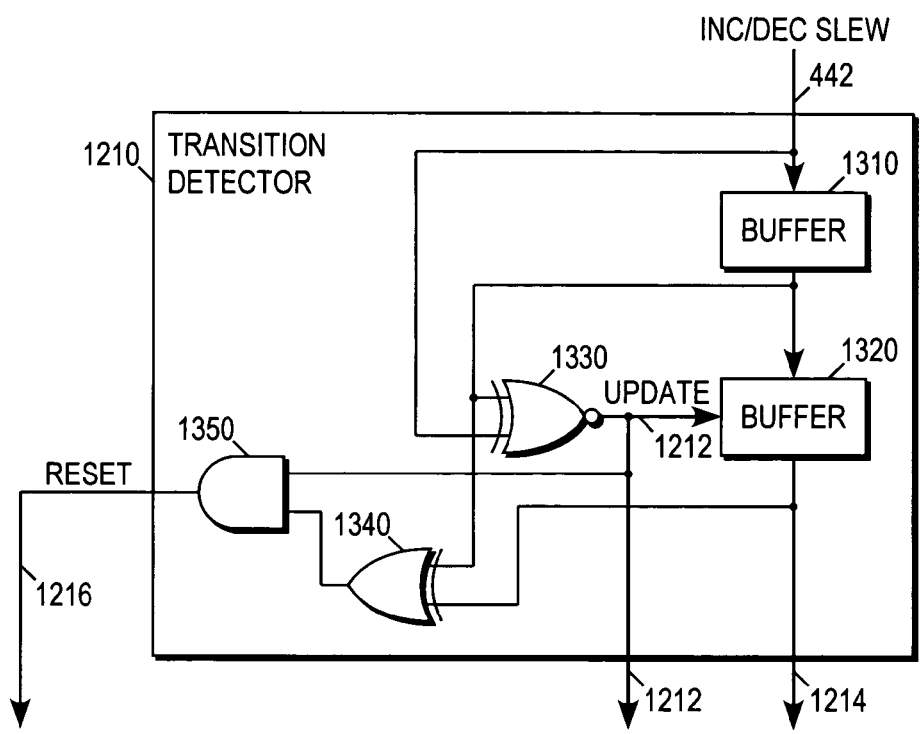
FIG. 13 illustrates, for one embodiment, a block diagram of circuitry for a transition detector of FIG. 12.

Transition detector 1210 for one embodiment, as illustrated in FIG. 13, may comprise circuitry to implement buffers 1310 and 1320, an exclusive-NOR (XNOR) gate 1330, an exclusive-OR (XOR) gate 1340, and AND gate 1350.

Buffer 1310 is coupled to receive the sequence of increase/decrease slew signals 442 for transition detector 1210 and to store and output each such signal to buffer 1320. Buffer 1320 is coupled to receive and store an increase/decrease slew signal 442 from buffer 1310 when enabled by counter update signal 1212 generated and output from XNOR gate 1330. Buffer 1320 for one embodiment may output its stored increase/decrease slew signal 442 as signal 1214 for transition detector 1210. XNOR gate 1330 is coupled to receive the increase/decrease slew signal 442 newly received by buffer 1310 and the increase/decrease slew signal 442 stored and output from buffer 1310 and generates and outputs counter update signal 1212 when both such signals are the same. Buffer 1320 therefore only receives and stores an increase/decrease slew signal 442 having the same value as the next increase/decrease slew signal 442 in the received sequence, and counter 1220 is also only updated in response to an increase/decrease slew signal 442 having the same value as the next increase/decrease slew signal 442 in the received sequence. When the increase/decrease slew signal 442 newly received by buffer 1310 and the increase/decrease slew signal 442 stored and output from buffer 1310 have a different value, the increase/decrease slew signal 442 stored and output from buffer 1310 is not stored by buffer 1320 and counter 1220 is not updated.

When buffer 1310 receives two consecutive increase/decrease slew signals 442 having the same value but different from that of the increase/decrease slew signal 442 stored in buffer 1320, XNOR gate 1330, XOR gate 1340, and AND gate 1350 function to generate and output reset signal 1216 to change the value of increase/decrease slew signals 442 to be counted by counter 1220. XNOR gate 1330 outputs counter update signal 1212 that identifies whether two consecutive increase/decrease slew signals 442 received by buffer 1310 have the same value. XOR gate 1340 is coupled to receive the increase/decrease slew signal 442 stored and output from buffer 1310 and the increase/decrease slew signal 442 stored and output from buffer 1320 and generates and outputs a signal identifying whether such signals have a different value. Because AND gate 1350 is coupled to receive the signals output from XNOR gate 1330 and XOR gate 1340, AND gate 1350 generates and outputs reset signal 1216 when two consecutive increase/decrease slew signals 442 received by buffer 1310 have the same value but different from that of the increase/decrease slew signal 442 stored in buffer 1320.

For one embodiment where digital filter 1202 comprises circuitry as illustrated in FIG. 12, compensation signal generator 1204 for one embodiment, as illustrated in FIG. 12, may comprise circuitry to implement a thermometer code buffer 1240, a multiplexer or MUX 1250, a reset code setter 1252, an up shifter 1254, and a down shifter 1256.

Thermometer code buffer 1240 stores a thermometer code for output from compensation signal generator 1204 as slew rate control signals 212. Buffer 1240 is coupled to receive an updated thermometer code from an output of MUX 1250 and an update signal 1232 from digital filter 1202 and is enabled to store and output an updated thermometer code in response to the update signal 1232. Buffer 1240 may store a thermometer code of any suitable number of bits.

MUX 1250 for one embodiment may have an input coupled to receive a reset code output from reset code setter 1252 and an input coupled to receive a reset signal 1251 and may output the reset code in response to reset signal 1251. Reset code setter 1252 may comprise any suitable circuitry to output any suitable reset code. Reset code setter 1252 for one embodiment may be hardwired with a reset code. Reset code setter 1252 for another embodiment may comprise a suitable memory device, such as a register for example, that may be programmed with any suitable reset code. The thermometer code of buffer 1240 for one embodiment may be initialized or reset to the reset code in response to update signal generator 1230 of digital filter 1202 receiving a reset signal 1231 to generate and output an update signal 1232 to buffer 1240.

For another embodiment, buffer 1240 may comprise suitable circuitry to allow the content of buffer 1240 to be reset to a predetermined value, such as all zeroes for example, to initialize or reset the thermometer code.

MUX 1250 for one embodiment may have an input coupled to receive an updated thermometer code from up shifter 1254 and an input coupled to receive an updated thermometer code from down shifter 1256. Up shifter 1254 is coupled to receive the thermometer code stored and output from buffer 1240 and may comprise any suitable circuitry to shift the thermometer code by any suitable number of one or more bits, such as one for example, so as to produce an updated thermometer code that would increase a slew rate controlled using slew rate control signals 212. Down shifter 1256 is coupled to receive the thermometer code stored and output from buffer 1240 and may comprise any suitable circuitry to shift the thermometer code by any suitable number of one or more bits, such as one for example, so as to produce an updated thermometer code that would decrease a slew rate controlled using slew rate control signals 212.

MUX 1250 for one embodiment may have an input coupled to receive a suitable increase/decrease control signal from any suitable source and may output an updated thermometer code from either up shifter 1254 or down shifter 1256 in response to such an increase/decrease control signal. The increase/decrease control signal helps identify whether an update signal 1232 is to be or was output in response to increase/decrease slew signals 442 identifying that a slew rate of circuitry for an output buffer 410 is to be increased or decreased. MUX 1250 for one embodiment may receive signal 1214 output from transition detector 1210 of digital filter 1202 or a suitable buffered version of signal 1214 as an increase/decrease control signal.

Dither controller 1206 helps avoid generating noise resulting from repeatedly generating one or more slew rate control signals 452 and/or 212 to increase and then decrease a slew rate above and below a desired slew rate. Dither controller 1206 for one embodiment may comprise any suitable circuitry to help avoid dither by updating one or more slew rate control signals 452 output to circuitry for an output buffer 410 prior to updating one or more slew rate control signals 212 for one or more other output buffers exclusive of circuitry for an output buffer 410 to help identify whether slew rate controller 210 is possibly entering a dither condition. If slew rate controller 210 may enter a dither condition, dither controller 1206 for one embodiment may then return to using the prior slew rate control signal(s) 452 and help avoid updating slew rate control signal(s) 212. If slew rate controller 210 is not entering a dither condition, dither controller 1206 for one embodiment may then continue using the updated slew rate control signal(s) 452 and either update slew rate control signal(s) 212 or allow slew rate control signal(s) 212 to be updated.

For one embodiment where digital filter 1202 and compensation signal generator 1204 comprise circuitry as illustrated in FIG. 12, dither controller 1206 for one embodiment, as illustrated in FIG. 12, may comprise circuitry to implement a multiplexer or MUX 1260 and a count decoder 1262.

MUX 1260 for one embodiment has an input coupled to receive a current thermometer code output from buffer 1240, an input coupled to receive an updated thermometer code output from MUX 1250, and an input coupled to receive a control signal output from count decoder 1262 to output either the current or updated thermometer code as slew rate control signals 452 in response to the count decoder control signal.

Count decoder 1262 for one embodiment may be coupled to receive one or more signals 1222 output from counter 1220 of digital filter 1202 to identify based on such signal(s) 1222 whether the thermometer code of buffer 1240 may soon be updated. For one embodiment where update signal generator 1230 of digital filter 1202 outputs an update signal 1232 when the count of counter 1220 satisfies one or more conditions, count decoder 1262 for one embodiment may identify whether the count of counter 1220 is nearing satisfying the one or more conditions by identifying whether the count satisfies another one or more conditions. As one example where update signal generator 1230 of digital filter 1202 outputs an update signal 1232 when the count of counter 1220 reaches or exceeds a predetermined number, such as thirty-two for example, count decoder 1262 for one embodiment may identify whether the count of counter 1220 is nearing the predetermined number by identifying whether the count has reached or exceeded another predetermined number, such as twenty-eight for example.

MUX 1260 for one embodiment may output the updated thermometer code output from MUX 1250 as slew rate control signals 452 in response to count decoder 1262 identifying that the thermometer code of buffer 1240 may soon be updated to help identify whether slew rate controller 210 is possibly entering a dither condition.

If slew rate controller 210 is possibly entering a dither condition, counter 1220 for one embodiment will be reset in response to the updating of slew rate control signals 452 and prior to update signal generator 1230 outputting an update signal 1232 to buffer 1240. The thermometer code of buffer 1240 will therefore not be updated, and MUX 1260 will return to outputting the thermometer code of buffer 1240 as slew rate control signals 452 in response to count decoder 1262 decoding the reset count.

If slew rate controller 210 is not entering a dither condition, counter 1220 may continue counting without reset after the updating of slew rate control signals 452 until update signal generator 1230 outputs an update signal 1232 to buffer 1240 to update the thermometer code of buffer 1240 and therefore update slew rate control signals 212. MUX 1260 may continue outputting the updated thermometer code from MUX 1250 as slew rate control signals 452 until count decoder 1262 identifies the count of counter 1220 has been reset and then output the already updated thermometer code of buffer 1240 as slew rate control signals 452, effectively continuing output of the updated slew rate control signals 452.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   identifying delay of a generated signal through circuitry for an output buffer, wherein the delay is relative to a clock signal; and
   independently controlling each of a falling edge slew rate and a rising edge slew rate of the circuitry in response to the identifying.

2. The method of claim 1, wherein the identifying comprises identifying a delay for generating an edge cycle completion signal relative to an amount of time defined by a clock signal.

3. The method of claim 1, wherein the identifying comprises detecting an edge of the generated signal relative to an edge of the clock signal.

4. The method of claim 1, wherein the identifying comprises identifying a delay of the circuitry in generating a rising signal edge relative to an amount of time defined by the clock signal; and
   wherein the method comprises identifying a delay of the circuitry for an output buffer in generating a falling signal edge relative to an amount of time defined by the clock signal.

5. The method of claim 1, comprising independently controlling a falling edge slew rate and a rising edge slew rate of one or more output buffers in response to the identifying.

6. A method comprising:
   detecting a rising edge generated by circuitry for an output buffer relative to a first edge of a clock signal;
   detecting a falling edge generated by the circuitry relative to a second edge of the clock signal; and
   independently controlling rising and falling edge slew rates of the circuitry in response to the detecting.

7. The method of claim 6, comprising inputting another clock signal into the circuitry.

8. The method of claim 6, wherein the detecting the rising signal edge comprises detecting a rising edge of an edge cycle completion signal generated by the circuitry; and
   wherein the detecting the falling signal edge comprises detecting a falling edge of an edge cycle completion signal generated by the circuitry for an output buffer.

9. The method of claim 6, comprising independently controlling rising and falling signal edge slew rates of one or more output buffers in response to the detecting.

10. An apparatus comprising:
    circuitry for an output buffer;
    an edge detector receiving a clock signal and a signal generated by the circuitry, wherein the edge detector identifies delays of the generated signal relative to an amount of time defined by the clock signal; and
    a slew rate signal generator generating one or more slew rate control signals in response to the delays, wherein the slew rate control signals independently control each of a falling edge slew rate and a rising edge slew rate of the circuitry.

11. The apparatus of claim 10, wherein the signal generated by the circuitry for an output buffer is an edge cycle completion signal.

12. The apparatus of claim 10, wherein the edge detector identifies a delay of the circuitry in generating a rising edge relative to an amount of time defined by the clock signal, wherein the edge detector identifies a delay of the circuitry in generating a falling edge relative to an amount of time defined by the clock signal.

13. The apparatus of claim 10, comprising one or more output buffers, wherein the slew rate control signal generator is to generate one or more slew rate control signals to control at least one of the falling edge slew rate and the rising edge slew rate of the one or more output buffers.

14. An apparatus comprising:
   circuitry for an output buffer, the circuitry providing a generated signal;
   a rising edge detector for detecting a rising edge of the generated signal relative to a first edge of a clock signal;
   a falling edge detector for detecting a falling edge of the generated signal relative to a second edge of the clock signal; and
   a slew rate control signal generator independently controlling a falling edge slew rate and a rising edge slew rate of the circuitry in response to the detected falling and rising edges.

15. The apparatus of claim 14, comprising an input signal generator providing the clock signal as an input to the circuitry.

16. The apparatus of claim 14, wherein the generated signal is an edge cycle completion signal.

17. The apparatus of claim 14, comprising one or more output buffers, wherein the slew rate control signal generator generates slew rate control signals to control rising and falling edge slew rates independently for the one or more output buffers.

18. An apparatus comprising:
   circuitry for an output buffer, the circuitry providing a generated signal;
   means for identifying one or more delays of the generated signal relative to an amount of time defined by a clock signal; and
   means for independently controlling a falling edge slew rate and a rising edge slew rate of the circuitry in response to the delays.

19. The apparatus of claim 18, comprising one or more output buffers; and
   means for independently controlling a falling edge slew rate and a rising edge slew rate of the one or more output buffers.

20. An apparatus comprising:
   circuitry for an output buffer;
   means for detecting rising and falling edges of a signal generated by the circuitry relative to edges of a clock signal; and
   means for independently controlling rising and falling edge slew rates of the circuitry.

21. The apparatus of claim 20, comprising one or more output buffers; and
   means for independently controlling rising and falling edge slew rates of the one or more output buffers.

22. A system comprising:
   a bus comprising one or more lines;
   a clock source to generate a clock signal; and
   a plurality of devices coupled to the bus, wherein at least one device is coupled to the clock source and comprises one or more output buffers to output signals over one or more lines of the bus and a slew rate controller to identify one or more delays of circuitry for an output buffer in generating a signal relative to an amount of time defined using the clock signal and to independently control each of a falling edge slew rate and a rising edge slew rate of the circuitry based on the identified delay.

23. The system of claim 22, wherein the slew rate controller is to identify a delay of the circuitry in generating a rising edge of the signal relative to an amount of time defined using the clock signal and is to identify a delay of the circuitry in generating a falling edge of the signal relative to an amount of time defined using the clock signal.

24. A system comprising:
   a bus comprising one or more lines;
   a clock source to generate a clock signal; and
   a plurality of devices coupled to the bus, wherein at least one device is coupled to the clock source and comprises one or more output buffers to output signals over one or more lines of the bus and a slew rate controller to detect rising and falling edges of a signal generated by circuitry for an output buffer relative to edges defined using the clock signal, wherein the slew rate controller independently controls rising and falling edge slew rates for both the circuitry and the one or more output buffers based on the detections.

* * * * *